United States Patent
Shafai et al.

(10) Patent No.: US 10,693,393 B2
(45) Date of Patent: Jun. 23, 2020

(54) ELECTROSTATIC ACTUATOR WITH TRI-ELECTRODE TOPOLOGY

(71) Applicant: University of Manitoba, Winnipeg (CA)

(72) Inventors: Cyrus Shafai, Winnieg (CA); Yu Zhou, Winnipeg (CA)

(73) Assignee: University of Manitoba, Winnipeg (CA)

( * ) Notice: Subject to any disclaimer, the term of this patent is extended or adjusted under 35 U.S.C. 154(b) by 37 days.

(21) Appl. No.: 15/987,564

(22) Filed: May 23, 2018

(65) Prior Publication Data

US 2019/0036463 A1   Jan. 31, 2019

Related U.S. Application Data

(60) Provisional application No. 62/514,158, filed on Jun. 2, 2017.

(51) Int. Cl.
   *H02N 1/06* (2006.01)
   *H02N 1/00* (2006.01)
   *B81B 3/00* (2006.01)

(52) U.S. Cl.
   CPC .......... *H02N 1/006* (2013.01); *B81B 3/0037* (2013.01); *B81B 2201/038* (2013.01); *B81B 2203/04* (2013.01); *B81B 2203/053* (2013.01)

(58) Field of Classification Search
   CPC .. H02N 1/006; B81B 3/0037; B81B 2201/038
   USPC .......................................................... 310/309
   See application file for complete search history.

(56) References Cited

U.S. PATENT DOCUMENTS

| | | | | |
|---|---|---|---|---|
| 3,394,274 A | * | 7/1968 | Jacke | B05B 17/0623 310/325 |
| 8,198,948 B2 | * | 6/2012 | Nishizawa | G01C 19/5621 310/365 |
| 2010/0163376 A1 | * | 7/2010 | Yoon | H02N 1/006 200/181 |

* cited by examiner

*Primary Examiner* — Terrance L Kenerly
(74) *Attorney, Agent, or Firm* — Kyle R Satterthwaite; Ryan W Dupuis; Ade & Company Inc.

(57) ABSTRACT

A new tri-electrode topology reduces the control voltage requirement for electrostatic actuators. Conventional parallel plate actuators are dual-electrode systems, formed by the MEMS structure and the drive electrode. By placing a perforated intermediate electrode between these elements, a tri-electrode configuration is formed. This topology enables a low voltage on the intermediate electrode to modulate the electrostatic force of the higher voltage drive electrode, whose voltage remains fixed. Results presented show that in comparison to conventional parallel plate electrostatic actuators, the intermediate electrode's modulating voltage can be as low as 20% of normal, while still providing the full actuation stroke.

10 Claims, 2 Drawing Sheets

US 10,693,393 B2

ELECTROSTATIC ACTUATOR WITH TRI-ELECTRODE TOPOLOGY

CROSS-REFERENCE TO RELATED APPLICATIONS

This application claims benefit under 35 U.S.C. 119(e) of U.S. Provisional Application No. 62/514,158, filed Jun. 2, 2017, the entirety of which is incorporated herein by reference.

FIELD OF THE INVENTION

The present invention relates generally to electrostatic actuators, and more particularly to a unique tri-electrode electrostatic actuator employing a perforated intermediate electrode between the stationary drive electrode and movable MEMS structure.

BACKGROUND

Electrostatic actuators are important components in the field of Microelectromechanical systems (MEMS). FIG. 1(a) shows a conventional electrostatic actuator, which features a base substrate 10 on which a drive electrode 12 is mounted in a stationary position, while a movable MEMS structure 14 carrying or containing a second electrode is suspended at a spaced distance D above the drive electrode, which is biased to a drive voltage $V_D$. The application of drive voltage $V_D$ creates an electric field incident on the second electrode of the MEMS structure 14, whereby electrostatic attraction of the second electrode of the MEMS structure toward the stationary drive electrode draws the MEMS structure toward the drive electrode and underlying base substrate. By varying the drive voltage, this displacement of the MEMS structure can be controlled. So the drive voltage, i.e. the voltage that generates the electric field attracting the movable second electrode toward the stationary drive electrode doubles as a control voltage, as it is the variation of this drive voltage that controls the displacement of the MEMS structure.

Such conventional electrostatic actuators suffer pull-in after displacing only approximately ⅓ of the electrode separation distance D, as described in below cited Hung et al. [1], thereby limiting the controllable displacement range. In other words, the controllable stroke of the MEMS structure is limited to a pull-in distance $D_{pull-in}$, which occurs at $V_{Dmax}$ and is approximately ⅓ of D. As a result, the drive electrode must be placed significantly distant from the MEMS structure when large controllable stroke is required. However, this leads to necessity of a significantly elevated driving voltage, since the electrostatic force is proportional to the square of the separation distance. In below-cited Seeger et al. [2], a capacitor in series with the electrode power supply was explored to avoid pull-in. However, this still suffers from the requirement for larger voltage as the series capacitor is charged in the effort to mitigate positive feedback of MEMS motion.

Accordingly, there remains room for improvement in the design of electrostatic actuators, and particularly a desire to reduce the control voltage required by such actuators.

SUMMARY OF THE INVENTION

According to a first aspect of the invention, there is provided an electrostatic actuator comprising:
a base;
a drive electrode mounted to the base in a stationary position thereon and connected or connectable to a first voltage source to apply a drive voltage to said drive electrode;
a movable electrode suspended over the drive electrode in spaced relation therefrom;
an intermediate electrode disposed between the drive electrode and the movable electrode in spaced relation from each thereof and connected or connectable to a variable second voltage source to apply a variable control voltage to said intermediate electrode, said intermediate electrode having a plurality of openings therein at an area thereof overlying the drive electrode;
whereby an electric field generated by application of the drive voltage to the drive electrode passes through the openings in the intermediate electrode and is modulated by the variable control voltage applied to the intermediate electrode.

By applying voltage to the drive electrode while varying the effect of the resulting electric field on the movable electrode by application of the variable control voltage to the perforated intermediate electrode, the control voltage is reduced relative to conventional designs where the voltage applied to the drive electrode is itself the sole control input concerning the displacement of the movable electrode.

Preferably the openings in the intermediate electrode each have a width less than, equal or similar to a distance between the movable electrode and the intermediate electrode.

The drive voltage may be a fixed constant voltage, or a variable voltage.

Preferably a thickness of the intermediate electrode is smaller than the openings in the intermediate electrode and less than a distance from said intermediate electrode to the movable electrode.

A method of operating the electrostatic actuator comprises varying the control voltage applied to the intermediate electrode while applying said drive voltage to the drive electrode, and thereby modulating the electric field passing through said openings in the intermediate electrode.

BRIEF DESCRIPTION OF THE DRAWINGS

One embodiment of the invention will now be described in conjunction with the accompanying drawings in which:

FIG. 2A shows the electrical field distribution passing through the intermediate electrode perforations when $V_i=-0.2\ V_{Dmax}$, where $V_i$ is the control voltage applied to the intermediate electrode voltage and $V_{Dmax}$ is the maximum value of the conventional drive voltage at pull-in.

DETAILED DESCRIPTION

Figure 1A:
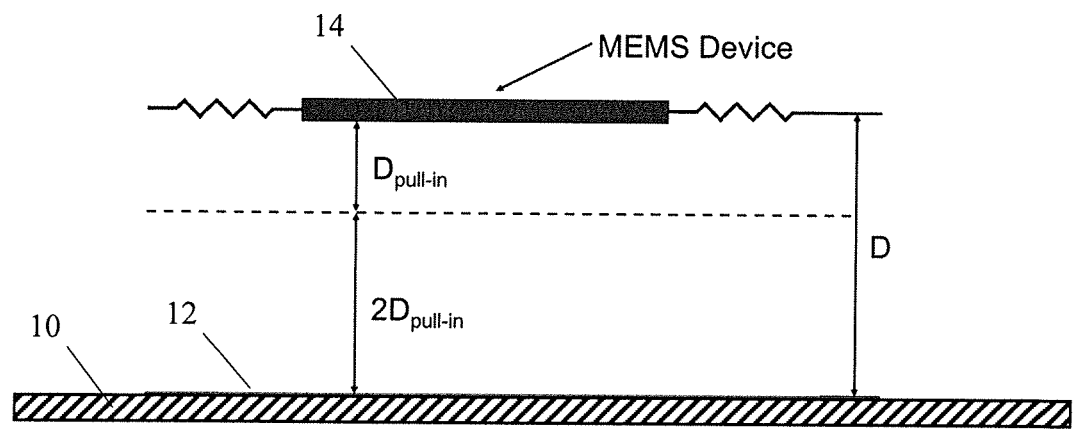
FIG. 1A schematically illustrates a conventional electrostatic actuator.
Figure 1B:
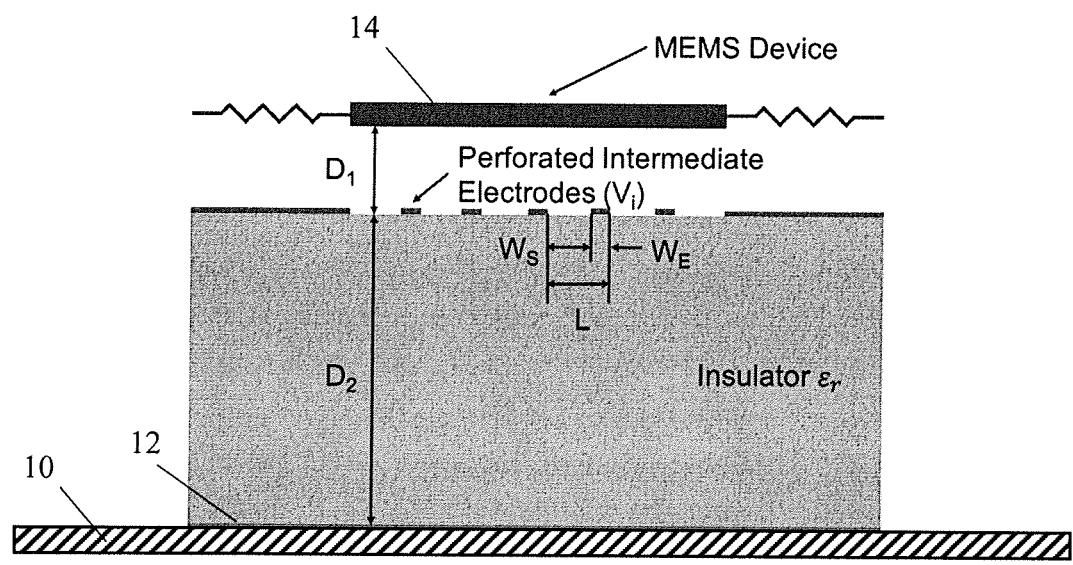
FIG. 1B schematically illustrates a modified electrostatic actuator of the present invention, featuring a perforated intermediate electrode.

In the novel electrostatic actuator of the presently disclosed invention, an intermediate electrode is used to modulate the electrostatic force between the underlying drive electrode and the MEMS structure suspended thereabove. The resulting tri-electrode topology is shown in FIG. 1(b), where a movable MEMS structure is suspended in spaced relation above a stationary drive electrode that is fixed atop a base substrate so that the electric field generated by the drive electrode when biased to a drive voltage will attract the movable second electrode of the MEMS structure. The intermediate electrode is a perforated unit, intact areas of which define solid elements of width $W_E$. These intact solid elements are spaced apart from one another by the perforated openings of width $W_S$. An electrode-spacing pitch length of the intact solid elements is therefore $L=W_E+W_S$. While the 2-dimensional elevational view in FIG. 2 shows only a single row (linear 1D array) of perforations overlying the drive electrode, it will be appreciated that in other scenarios, multiple rows (a 2D array) of perforations may be provided over a larger area of the intermediate electrode. Uniform spacing in multiple directions may be promoted by use circular perforations of diameter $d=W_S$, and use of a honeycomb/hexagonal layout pattern in the 2D array so that adjacent rows are offset from one another by $\frac{1}{2}(W_E+W_S)$.

The intermediate electrode is held in a fixed position at a first distance $D_1$ below the MEMS structure, and a second distance $D_2$ above the drive electrode. Unlike the conventional electrostatic actuators that apply a variable control voltage to the drive electrode, the drive electrode of the present invention is instead held at a fixed voltage $V_P$ by a constant voltage source, and a variable control voltage is applied to the perforated intermediate electrode by an adjustable voltage source connected thereto. When $D_1$ is smaller or similar to $W_S$, the electric field exerted on the MEMS structure, having passed through the intermediate electrode's perforation openings, can be effectively modulated by application of the variable control voltage $V_i$ to the intermediate electrode. The electric field modulation is illustrated in the FEM simulation of FIG. 2 for the case of $W_E=0.14L$, $D_1=0.4L$, $D_2=0.6\varepsilon_r L$, and $V_i=\pm 0.2\ V_{Dmax}$, where $V_{Dmax}$ represents the drive voltage required to attain the pull-in displacement in a conventional actuator. The results demonstrate that a voltage $V_i$ only 20% of $V_D$ can significantly change the electric field incident on the MEMS structure.

Figure 2A:
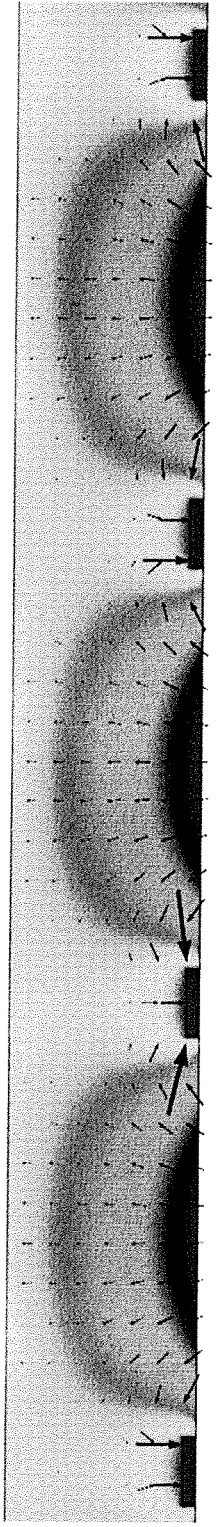
Figure 2B:
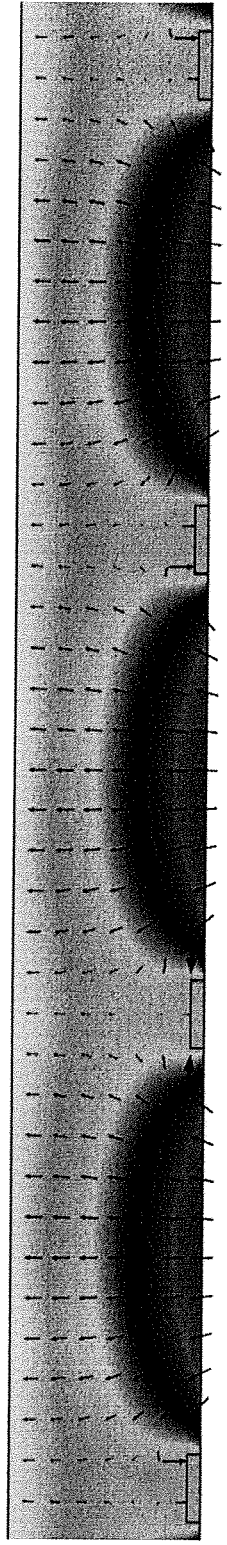
FIG. 2B shows the electrical field distribution passing through the intermediate electrode perforations when $V_i=0.2\ V_{Dmax}$.

If $D_1$ is increased notably beyond $W_S$, the performance of the actuator will quickly diminish, as the degree by which the drive electrode's electric field can fringe through the perforations of the plate will be reduced. What the voltage on the intermediate electrode effectively does, is control the strength of the fringing fields that reach the MEMS device. This can be seen from comparison of FIGS. 2A and 2B. In FIG. 2A, it can be seen that the fringing electric field passing through the holes in the intermediate electrode is only weakly reaching the MEMS device, while in FIG. 2B, the fringing field is more strongly reaching the MEMS device.

Figure 4:
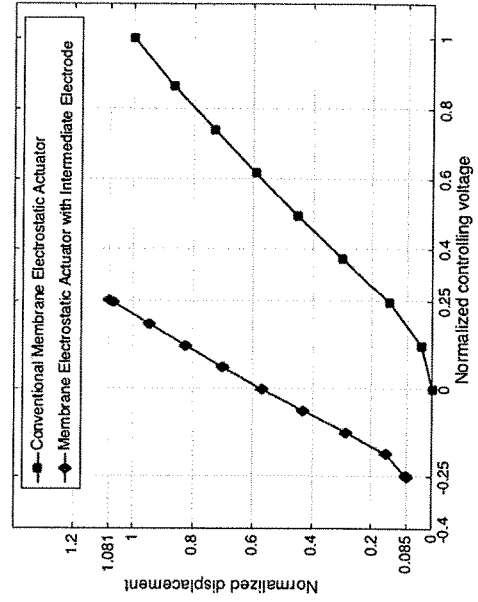
FIG. 4 graphically compares simulation of a conventional membrane actuator against the actuator of the present invention to achieve the same displacement, and demonstrating notable reduction of the control voltage to −0.25 $V_{Dmax} < V_i < 0.25\ V_{Dmax}$.
Figure 3:
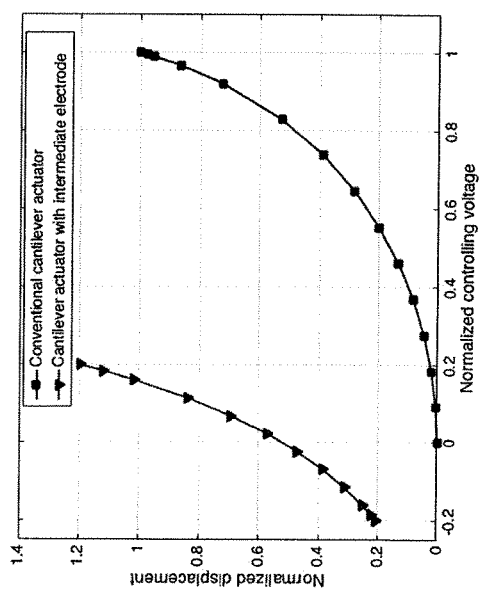
FIG. 3 graphically compares simulation of a conventional cantilever actuator against the actuator of the present invention to achieve the same displacement, and demonstrating notable reduction of the control voltage to $-0.2\ V_{Dmax} < V_i < 0.2\ V_{Dmax}$.

FIGS. 3 and 4 compare the tri-electrode topology of the present invention to conventional parallel plate cantilever and membrane actuators. Displacement is plotted normalized to $D_{pull-in}$ for the conventional actuators. We can see that the tri-electrode topology can achieve the same controllable stroke using a control voltage range of only −0.2 $V_{Dmax} < V_i < 0.2\ V_{Dmax}$ for the cantilever case, and only −0.25 $V_{Dmax} < V_i < 0.25\ V_{Dmax}$ for the membrane. Also, the tri-electrode topology has controllable stroke>80% of $D_1$ for the cantilever and >70% of $D_1$ for the membrane, illustrating that the intermediate electrode does not suffer pull-in for most of $D_1$. While comparison is made against conventional cantilever and membrane actuators because they are very common, the tri-electrode topology can be used in any electrostatic force controlled actuator, including cantilever, membrane, bridge type actuators, and micro-spring supported MEMS devices. While the illustrated embodiment includes insulation material between the drive electrode and the intermediate electrode, this is not essential to operation of the actuator as long as these electrodes are spaced apart in non-conductive relation to one another. For example, a simple air gap between the drive and intermediate electrodes may take the place of the illustrated insulation layer.

The tri-electrode topology thus provides notable advantage over conventional actuators in that the control voltage is significantly lower. Instead of using only a voltage on the bottom electrode, adding the intermediate electrode enables control over the MEMS motion with a control voltage of approximately ⅕-¼ of what normally would have been required on the bottom electrode in a conventional actuator. It will be appreciated that these specific numerical results are cited in relation to the particularly geometry, sizing and spacing used the experimental simulation on which the appended figures are based, and the level of performance may vary, and possibly improve, by varying the spacing and/or other characteristics of the design.

The reduction in control voltage is beneficial in many applications. For example, in the case of larger displacement actuators providing several micrometers of motion, the variable control voltage required at the bottom electrode of a conventional actuator is commonly is over 50 V, and sometimes several hundred volts. Such high voltages are not available on normal integrated circuit (IC) chips, and so special high voltage electronics are needed. However, by using the intermediate electrode as the control electrode in the presently disclosed tri-electrode topology, reduced voltages in the range commonly available on-chip can be used to provide the control voltage to the intermediate electrode.

Accordingly, on an IC chip having a plurality of large displacement actuators that each require independent variable control (e.g. in adaptive optics design), all of the actuators can share a single common higher voltage amplifier to provide the constant voltage to their drive electrodes, and then use respective on-board low voltage variable amplifiers on the same chip to provide the individual control voltages to the intermediate electrodes of the different actuators. This provides a much more elegant solution than the conventional adaptive optics chip design, where a multitude of large displacement actuators on the same chip would require connections to respective off-chip higher voltage variable amplifiers. So where the prior art was forced to sacrifice either the available actuator displacement range (by using on-board low voltage amplifiers incapable of providing larger displacement functionality), or the space-efficiency of the design (by using off-chip high voltage amplifiers capable of enabling larger displacement), the present invention can be used to provide both large displacement capabilities and space-efficient on-chip control amplifier layout.

Aside from adaptive optics, electrostatic actuators in other applications are often limited in their movement range due to limitation of the available drive voltage on chip. With the tri-electrode topology of the present invention, by reducing the control voltage requirements, better performance may be achievable in many other applications using electrostatic actuators. Some examples where electrostatic actuators are used include: MEMS speakers; variable capacitors and switches and filters/resonators for tunable electronics or other applications; and in the optics field where controllable mirror tilting and lens or optical element movement can be required in some environments. While the specific embodiments contemplated above use a fixed constant voltage on the drive electrode since variation at only the intermediate electrode is sufficient to control the movement of the MEMS device, the voltage on the drive electrode may also be varied without departing the from the novel structure and operation of the tri-electrode topology of the present invention.

The thickness of the metal conducting material used for the intermediate electrode can be an issue if it is similar to the intermediate electrode's perforation size or the spacing of the intermediate electrode from the MEMS device. Basically, since the fringing electric field has to pass through the intermediate electrode to get to the MEMS device, a significantly thick intermediate electrode forms part of the distance the electric field has to travel. In practice the metal of the intermediate electrode will sized much thinner than the spacing from the intermediate electrode to the MEMS device.

Since various modifications can be made in my invention as herein above described, and many apparently widely different embodiments of same made, it is intended that all matter contained in the accompanying specification shall be interpreted as illustrative only and not in a limiting sense.

REFERENCES

[1] E. S. Hung, S. D. Senturia (1999): Extending the travel range of analog-tuned electrostatic actuators, *J. Microelectromech. Syst.*, 8, pp. 497-505.
[2] J. I. Seeger, S. B. Crary (1997): Analysis and simulation of MOS capacitor feedback for stabilizing electrostatically actuated mechanical devices, *Transactions on the Built Environment*, 31, ISSN 1743-3509.

The invention claimed is:

1. An electrostatic actuator comprising:
   a base;
   a drive electrode mounted to the base in a stationary position thereon and connected to a first voltage source configured to apply a drive voltage to said drive electrode;
   a movable electrode suspended over the drive electrode in spaced relation therefrom;
   an intermediate electrode disposed between the drive electrode and the movable electrode in spaced relation from each thereof and connected to a variable second voltage source configured to apply a variable control voltage to said intermediate electrode, said intermediate electrode having a plurality of openings therein at an area thereof overlying the drive electrode;
   whereby an electric field generated by application of the drive voltage to the drive electrode passes through the openings in the intermediate electrode and is modulated by the variable control voltage applied to the intermediate electrode.

2. The electrostatic actuator of claim 1 wherein the openings in the intermediate electrode each have a width less than, equal or similar to a distance between the movable electrode and the intermediate electrode.

3. The electrostatic actuator of claim 1 wherein the first voltage source is a constant voltage source for providing a fixed drive voltage to the drive electrode.

4. The electrostatic actuator of claim 1 wherein a thickness of the intermediate electrode is smaller than the openings in the intermediate electrode and less than a distance from said intermediate electrode to the movable electrode.

5. A method of operating the electrostatic actuator of claim 1 comprising varying the control voltage applied to the intermediate electrode while applying said drive voltage to the drive electrode, and thereby modulating the electric field passing through said openings in the intermediate electrode.

6. The electrostatic actuator of claim 1 wherein the openings in the intermediate electrode comprise a group of openings, among which individual openings of said group reside at different respective distances from a perimeter of the intermediate electrode.

7. The electrostatic actuator of claim 1 wherein the openings in the intermediate electrode are laid out in one or more linear rows.

8. The electrostatic actuator of claim 7 wherein said one or more linear rows comprise multiple rows.

9. An electrostatic actuator set comprising:
   a plurality of electrostatic actuators according to claim 1;
   a shared common voltage amplifier connected to the drive electrodes of said plurality of electrostatic actuators to provide a same voltage thereto; and
   a plurality of variable voltage amplifiers respectively coupled to different individual electrostatic actuators among said plurality of electrostatic actuators to provide different respective variable control voltages thereto.

10. The electrostatic actuator set of claim 9 wherein said plurality of electrostatic actuators, and said plurality of variable voltage amplifiers, all reside on a shared chip.

* * * * *